United States Patent
Teo et al.

(10) Patent No.: US 8,614,484 B2
(45) Date of Patent: Dec. 24, 2013

(54) HIGH VOLTAGE DEVICE WITH PARTIAL SILICON GERMANIUM EPI SOURCE/DRAIN

(75) Inventors: Lee-Wee Teo, Singapore (SG); Ming Zhu, Singapore (SG); Harry Hak-Lay Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 433 days.

(21) Appl. No.: 12/647,031

(22) Filed: Dec. 24, 2009

(65) Prior Publication Data

US 2011/0156142 A1  Jun. 30, 2011

(51) Int. Cl.
*H01L 29/00* (2006.01)

(52) U.S. Cl.
USPC ............ 257/336; 257/E29.256; 257/E21.417; 438/286

(58) Field of Classification Search
USPC ............ 257/336, E29.256, E21.417; 438/286
See application file for complete search history.

(56) References Cited

U.S. PATENT DOCUMENTS

| | | | |
|---|---|---|---|
| 7,709,330 B2 * | 5/2010 | Cho et al. ...................... | 438/275 |
| 2004/0071269 A1 | 4/2004 | Wang et al. | |
| 2005/0275037 A1 * | 12/2005 | Chung .......................... | 257/374 |
| 2006/0099923 A1 | 5/2006 | Wildhagen | |
| 2006/0108616 A1 * | 5/2006 | Bu et al. ........................ | 257/288 |
| 2010/0052057 A1 * | 3/2010 | Chung et al. .................. | 257/362 |

FOREIGN PATENT DOCUMENTS

CN  101840931  9/2010

OTHER PUBLICATIONS

Chinese Patent Office, Office Action dated Mar. 29, 2012, Application No. 201010169915.7, 4 pages.

* cited by examiner

*Primary Examiner* — Timor Karimy
(74) *Attorney, Agent, or Firm* — Haynes and Boone, LLP

(57) ABSTRACT

A semiconductor device is provided which includes a semiconductor substrate, a gate structure formed on the substrate, sidewall spacers formed on each side of the gate structure, a source and a drain formed in the substrate on either side of the gate structure, the source and drain having a first type of conductivity, a lightly doped region formed in the substrate and aligned with a side of the gate structure, the lightly doped region having the first type of conductivity, and a barrier region formed in the substrate and adjacent the drain. The barrier region is formed by doping a dopant of a second type of conductivity different from the first type of conductivity.

20 Claims, 13 Drawing Sheets

HIGH VOLTAGE DEVICE WITH PARTIAL SILICON GERMANIUM EPI SOURCE/DRAIN

TECHNICAL FIELD

The present disclosure relates generally to semiconductor technology, and more particularly, to a high voltage semiconductor device and method of making the same.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

As semiconductor circuits such as complementary metal-oxide-semiconductor field effect transistors (CMOSFETs) are adapted for high voltage applications, several approaches have been utilized for incorporating a high voltage device with a low voltage device (e.g., logic device or memory device) for system-on-chip (SoC) technology. For example, a laterally diffused (LDMOS) device has been implemented as an asymmetric power MOSFET that is designed for low on-resistance coupled with high blocking voltage capability. The high blocking voltage capability can be achieved through formation of a resistive path which acts as a voltage drop in the channel region of the device. Therefore, what is needed is a high voltage device with improved high voltage blocking voltage capability and method of making the same.

SUMMARY

One of the broader forms of an embodiment of the present invention involves a semiconductor device. The semiconductor device includes a semiconductor substrate; a gate structure formed on the substrate; a lightly doped region formed in the substrate and aligned with a sidewall of the gate structure, the lightly doped region having a first type of conductivity; a source and a drain formed in the substrate at either side of the gate structure, the source and drain having the first type of conductivity; and a barrier region formed in the substrate and adjacent the drain. The barrier region is formed of a semiconductor material different from the semiconductor substrate and the barrier region has a second type of conductivity.

Another one of the broader forms of an embodiment of the present invention involves a method for fabricating a semiconductor device. The method includes providing a semiconductor substrate; forming a first well in the substrate, the first well having a first type of conductivity; forming a second well in the substrate, the second well having a second type of conductivity; forming a gate structure on the substrate, the gate structure having a first portion overlying the first well and a second portion overlying the second well; forming a lightly doped region in the second well, the lightly doped region having the first type of conductivity; forming a barrier region in the first well by an epitaxial process, the barrier region being formed of a semiconductor material different from the semiconductor substrate; and forming a source in the second well and a drain in the first well, the source and drain having the first type of conductivity, the drain being adjacent the barrier region.

Yet another one of the broader forms of an embodiment of the present invention involves a semiconductor device. The semiconductor device includes a semiconductor substrate; a first well of a first type of conductivity disposed in the substrate; a second well of a second type of conductivity disposed in the substrate; a gate structure disposed on the substrate, the gate structure having a first portion overlying the first well and a second portion overlying the second well; a source of the first type of conductivity disposed in the second well; a drain of the first type of conductivity disposed in the first well; and a barrier region disposed in the first well and adjacent the drain, the barrier region being formed of a semiconductor material different from the semiconductor substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
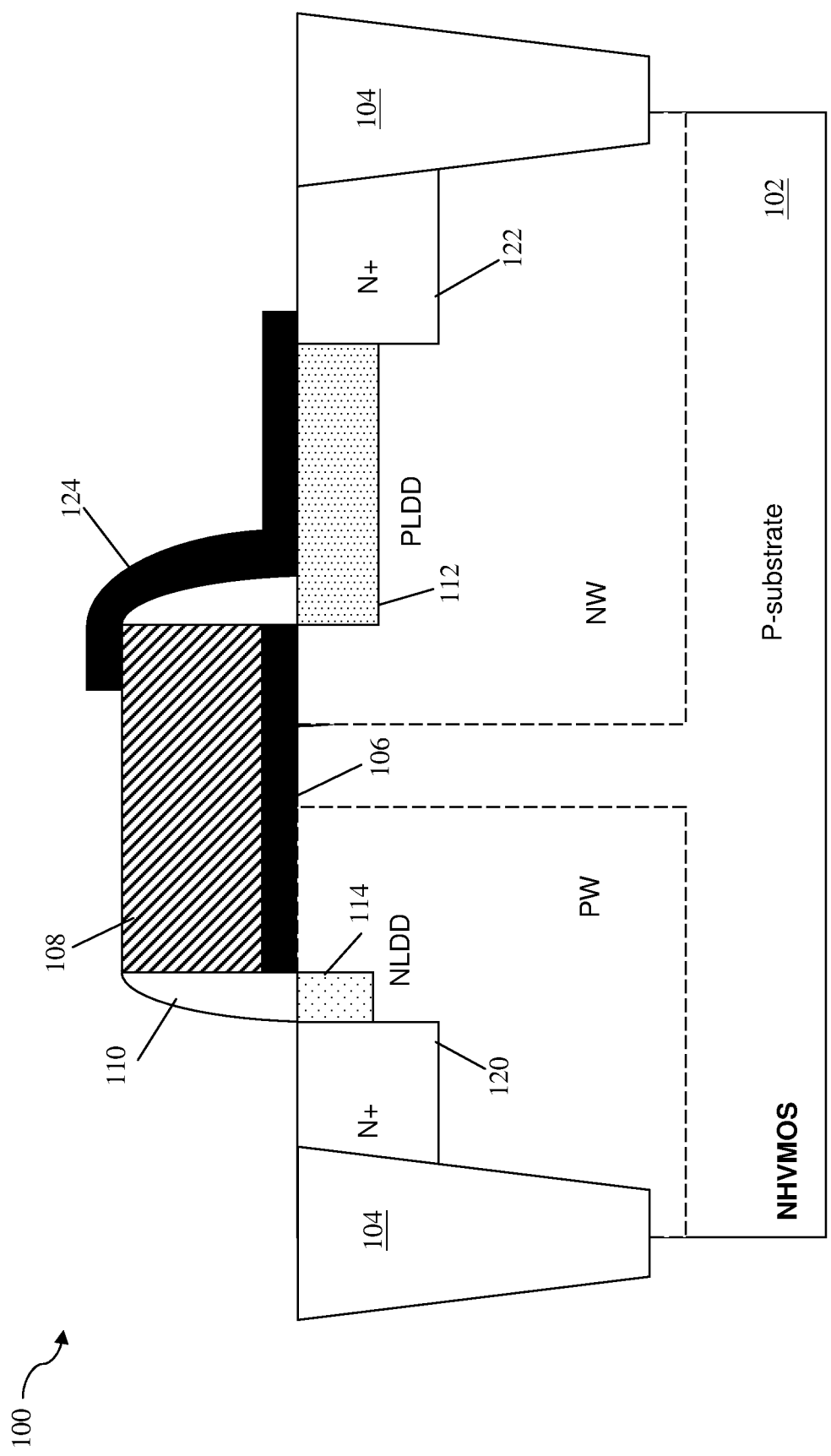
FIG. 1 is a cross-sectional view of a high voltage semiconductor device.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a cross-sectional view of a high voltage semiconductor device 100. The semiconductor device 100 is fabricated in a CMOS technology process flow. It is noted that the semiconductor device 100 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, the transistors that provide low voltage functionality may have operating (or drain) voltages of 1.1 V with standard CMOS technology, or voltages of 1.8/2.5/3.3 V with special (input/output) transistors in standard CMOS. The transistors that provide medium/high voltage functionality may have operating (or drain) voltages of 5 V or greater (e.g., 20-35 V). It is understood that the semiconductor device 100 may also include resistors, capacitors, inductors, diodes, and other suitable microelectronic devices that are typically implemented in integrated circuits. In the present embodiment, the semiconductor device 100 includes an n-type high voltage MOS (NHVMOS) device. The NHVMOS device may be referred to an n-type laterally diffused MOS (LDMOS) device.

The semiconductor device 100 includes a substrate 102. The substrate 102 may include a semiconductor wafer such as a silicon wafer. In the present embodiment, the substrate 102 includes a p-type silicon substrate (P-substrate). To form a complementary HVMOS, an n-type buried layer, i.e., deep n-well (DNW), may be implanted deeply under the active region of the p-type HVMOS (PHVMOS) of the P-substrate. An isolation feature structure 104 such as a shallow trench isolation (STI) or local oxidation of silicon (LOCOS) including the isolation feature may be formed in the substrate to define and electrically isolate various active regions.

The semiconductor device 100 includes an N-well (NW) formed in the substrate 102 adjacent to the isolation structure 104. The N-well may be referred to an extended drain or drain extension well. The semiconductor device 100 further includes a P-well (PW) formed in the p-substrate 102 adjacent to the isolation structure 104. The N-well and the P-well may be a portion of the substrate, and may formed by various ion implantation processes. Alternatively, the N-well and the P-well may be portions of an epitaxy layer such as a silicon epitaxy layer formed by epitaxy processing. The N-well may have an n-type dopant such as phosphorus, and the P-well may have a p-type dopant such as boron. In one embodiment, the N-well and P-well may be formed by a plurality of processing steps, whether now known or to be developed, such as growing a sacrificial oxide on substrate, opening a pattern for the location(s) of the P-well regions or N-well region, and implanting the impurities.

The semiconductor device 100 further includes a gate structure disposed on the substrate 102, including a gate dielectric 106 formed on the substrate, and a gate electrode 108 formed on the gate dielectric. The gate dielectric 106 may include a silicon oxide layer. Alternatively, the gate dielectric 106 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric 106 may have a multilayer structure such as one layer of silicon oxide and another layer of high k material. The gate dielectric 106 may be formed using chemical vapor deposition (CVD), physical vapor deposition (PVD), atomic layer deposition (ALD), thermal oxide, other suitable processes, or combinations thereof.

The gate electrode 108 may be configured to be coupled to metal interconnects and may be disposed overlying the gate dielectric. The gate electrode 108 may include a doped or non-doped polycrystalline silicon (or polysilicon). Alternatively, the gate electrode 108 layer may include a metal such as Al, Cu, W, Ti, Ta, TiN, TaN, NiSi, CoSi, other suitable conductive materials, or combinations thereof. The gate electrode 108 layer may be formed by CVD, PVD, ALD, plating, and other proper processes. The gate electrode layer may have a multilayer structure and may be formed in a multiple-step process.

Sidewall spacers 110 may be formed on both sidewalls of the gate structure. The sidewall spacers 110 may include a dielectric material such as silicon oxide. Alternatively, the sidewall spacers 110 may optionally include silicon nitride, silicon carbide, silicon oxynitride, or combinations thereof. In some embodiments, the sidewall spacers 110 may have a multilayer structure. The sidewall spacers 110 may be formed by a deposition and etching (e.g., anisotropic etching technique) as is known in the art.

The semiconductor device 100 further includes a barrier region 112. The barrier region 112 may be formed by a counter doping or reverse implantation process. As previously noted, the semiconductor device 100 may be include various n-type MOS (NMOS) and p-type MOS (PMOS) devices formed in other active regions of the substrate 102. Accordingly, a barrier region 112 may be formed locally and concurrently (same stage) with formation of lightly doped drain regions of a p-type (referred to as PLDD) in the other active regions of the substrate for the PMOS devices. A portion of the N-well may be exposed for forming the barrier region 112. The barrier region 112 may have an edge substantially self-aligned to an edge of the gate structure.

The semiconductor device 100 further includes a lightly doped source region 114 of an n-type (referred to as NLDD region) formed in the P-well. The NLDD region 114 may be laterally positioned on a sidewall of the gate structure. As previously noted, the semiconductor device 100 may also include PHVMOS device and various core NMOS and PMOS devices formed in other active regions of the substrate 102. Accordingly, the NLDD region 114 may be formed concurrently (same stage) with formation of lightly doped drain regions of an n-type in the other active regions of the substrate for the NMOS devices. The NLDD region 114 may have an edge substantially self-aligned to an edge of the gate structure. The NLDD region 114 may include n-type dopant such as phosphorus or arsenic. The NLDD region 114 may be formed by ion implantation or diffusion. It should be noted that the barrier region 112 may be protected with a patterned photoresist layer during formation of the NLDD region.

The semiconductor device 100 further includes a source region 120 and a drain region 122. A process to form source/drain of an n-type (referred to as N+ or heavily doped region) may be performed for the NMOS devices. The source 120 and drain 122 may be disposed at both sides of the gate structure and interposed thereby. The source 120 may include an edge substantially self-aligned to one of the sidewall spacers 110. The drain 122 may include an edge that is adjacent to the barrier region 112. Accordingly, a patterned photoresist layer may protect the barrier region 113 during formation of the drain. In the present embodiment, the source 120 and drain 122 regions include N-type dopant such as phosphorous or arsenic. The source 120 and drain 122 may be formed by a method such as ion implantation or diffusion.

The semiconductor device 100 further includes a resist protective oxide (RPO) 124 formed over the barrier region 112 that is not protected by the sidewall spacer 110. The RPO 124 may function as a silicide blocking layer during a subsequent salicide process. The barrier region 112 provides a resistive path which acts as a voltage drop in the channel region, and thus the semiconductor device 100 has a high blocking voltage ability. However, it has been observed that the resistive path may be improved by forming a barrier region through an epitaxial silicon germanium (SiGe) process flow that is utilized to form strained features for PMOS devices in other active regions of the substrate 102 as will be explained in detail below.

Figure 2:
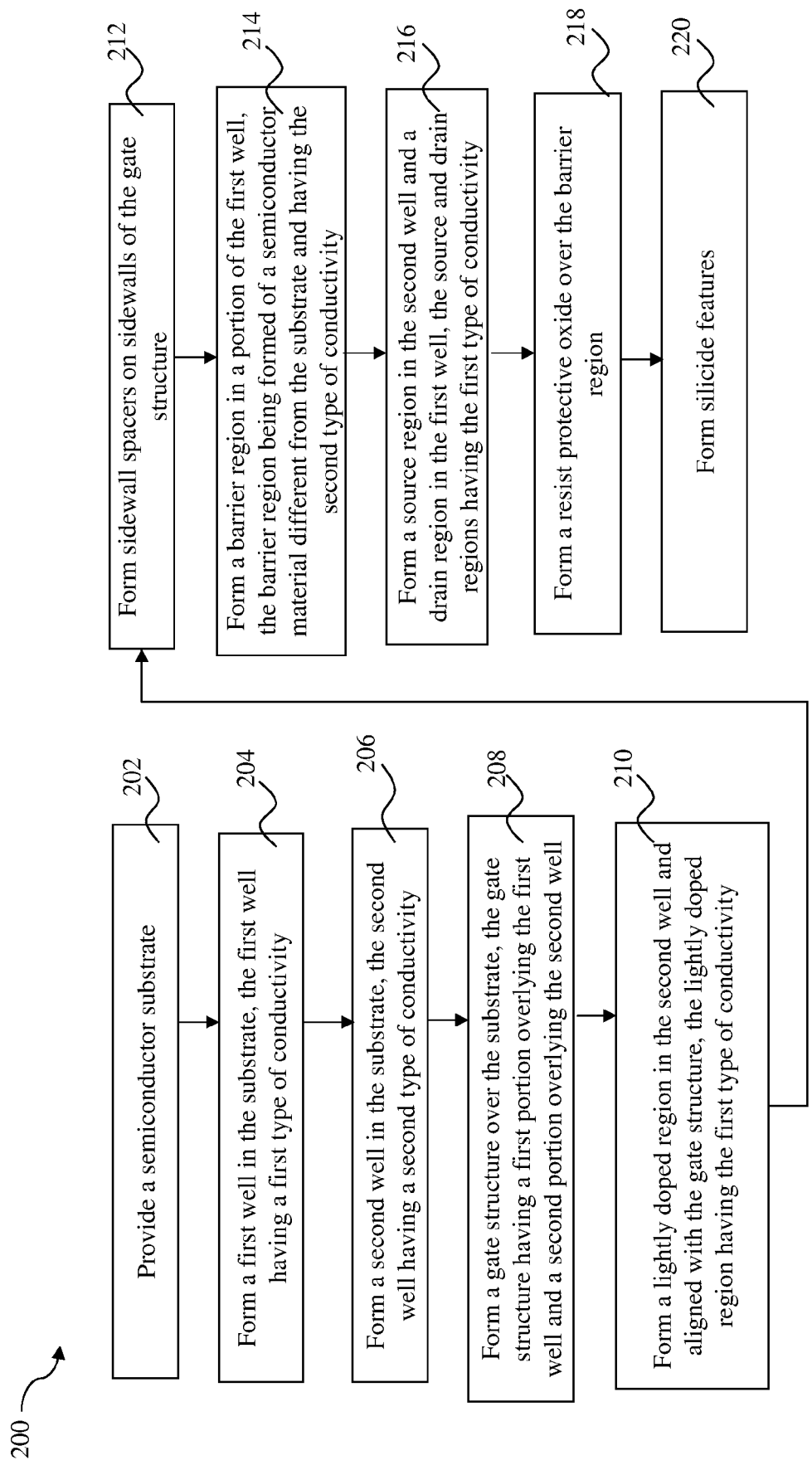
FIG. 2 is a flowchart of a method for fabricating a semiconductor device according to various aspects of the present disclosure.

Referring to FIG. 2, illustrated is a flow chart of a method 200 of fabricating a high voltage semiconductor device according to various aspects of the present disclosure. The method 200 begins with block 202 in which a semiconductor substrate is provided. The method 200 continues with block 204 in which a first well is formed in the substrate. The first well has a first type of conductivity. The method 200 continues with block 206 in which a second well is formed in the substrate. The second well has a second type of conductivity. The method 200 continues with block 208 in which a gate structure is formed over the substrate. The gate structure has a first portion that overlies the first well and a second portion that overlies the second well. The method 200 continues with block 210 in which a lightly doped region is formed in the second well and aligned with the gate structure. The lightly doped region has the first conductivity type.

The method 200 continues with block 212 in which sidewall spacers are formed on sidewalls of the gate structure. The method 200 continues with block 214 in which a barrier region is formed in a portion of the first well. The barrier region is formed of a semiconductor material different from the substrate. The barrier region has the second type of conductivity. The method 200 continues with block 216 in which a source region is formed in the second well and a drain region is formed in the first well. The source and drain regions have the first type of conductivity. The method 200 continues with block 218 in which a resist protective oxide is formed over the barrier region. The method 200 continues with block 220 in which silicide features are formed. The discussion that follows illustrates various embodiments of a semiconductor device that can be fabricated according to the method 200 of FIG. 2.

Referring FIGS. 3-13, illustrated is a high voltage semiconductor device 300 at various stages of fabrication according to the method 200 of FIG. 2. It is noted that FIGS. 3-13 have been simplified for a better understanding of the disclosed embodiment, and the semiconductor device 300 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, the transistors that provide low voltage functionality may have operating (or drain) voltages of 1.1 V with standard CMOS technology, or voltages of 1.8/2.5/3.3 V with special (input/output) transistors in standard CMOS. The transistors that provide medium/high voltage functionality may have operating (or drain) voltages of 5 V or greater (e.g., 20-35 V). It is understood that the semiconductor device 300 may also include resistors, capacitors, inductors, diodes, and other suitable microelectronic devices that are typically implemented in integrated circuits. In the present embodiment, the semiconductor device 300 includes an n-type high voltage MOS (NHVMOS) device.

Figure 3:
FIGS. 3-13 are cross-sectional views a semiconductor device at various stages of fabrication according to the method of FIG. 2.

In FIG. 3, the semiconductor device 300 includes a substrate 302. The substrate 302 includes a semiconductor wafer such as a silicon wafer. Alternatively, the substrate may include other elementary semiconductors such as germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer (epi layer) overlying a bulk semiconductor. Furthermore, the substrate 302 may include a semiconductor-on-insulator (SOI) structure. In various embodiments, the substrate may include a buried layer such as an N-type buried layer (NBL), a P-type buried layer (PBL), and/or a buried dielectric layer including a buried oxide (BOX) layer. In the present embodiment, the substrate 302 includes a P-type silicon substrate (P-substrate).

Isolation structures 304 such as shallow trench isolation (STI) or local oxidation of silicon (LOCOS) are formed in the substrate 302 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride. In the present embodiment, the isolation structures 304 may define a region for an NHVMOS device, a region for a core NMOS device (not shown), a region for a core PMOS device (not shown), a region for a PHVMOS device (not shown), and other regions for various microelectronic devices utilized in integrated circuits. It is understood that although only the NHVMOS device is illustrated, the processes disclosed below form corresponding features in the other active regions of the substrate 102 for the other types of devices.

Figure 4:
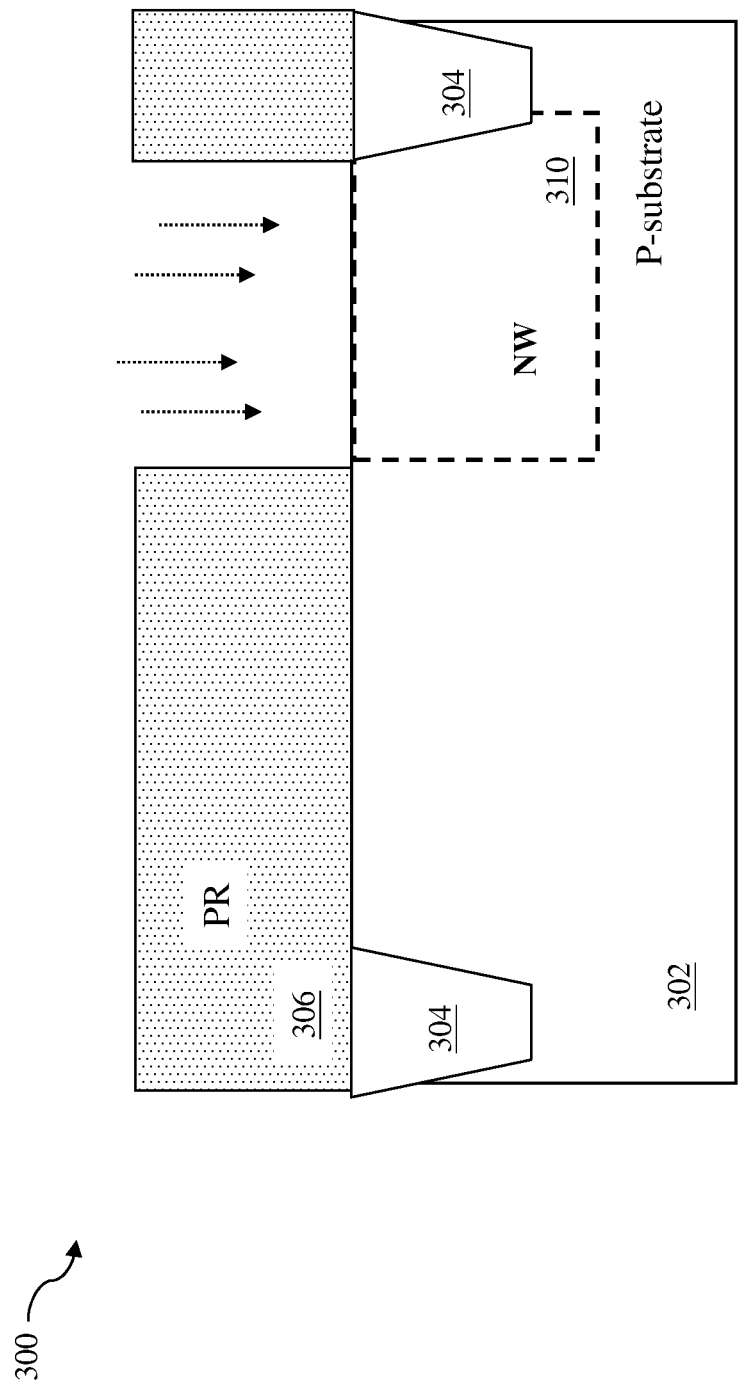

In FIG. 4, an N-well (NW) is formed in various regions of the P-substrate 302 by ion-implantation or diffusion techniques known in the art. For example, an N-well mask is used to pattern a photoresist layer 306 in a photolithography process or other suitable process. An exemplary photolithography process may include processing steps of photoresist coating, soft baking, mask aligning, exposing, post-exposure baking, developing, and hard baking. An ion implantation utilizing an N-type dopant, such as arsenic or phosphorus, may be performed to form the N-well (NW) 310 in the substrate 302. The N-well 310 may be referred to as an extended drain of the NHVMOS device.

Figure 5:
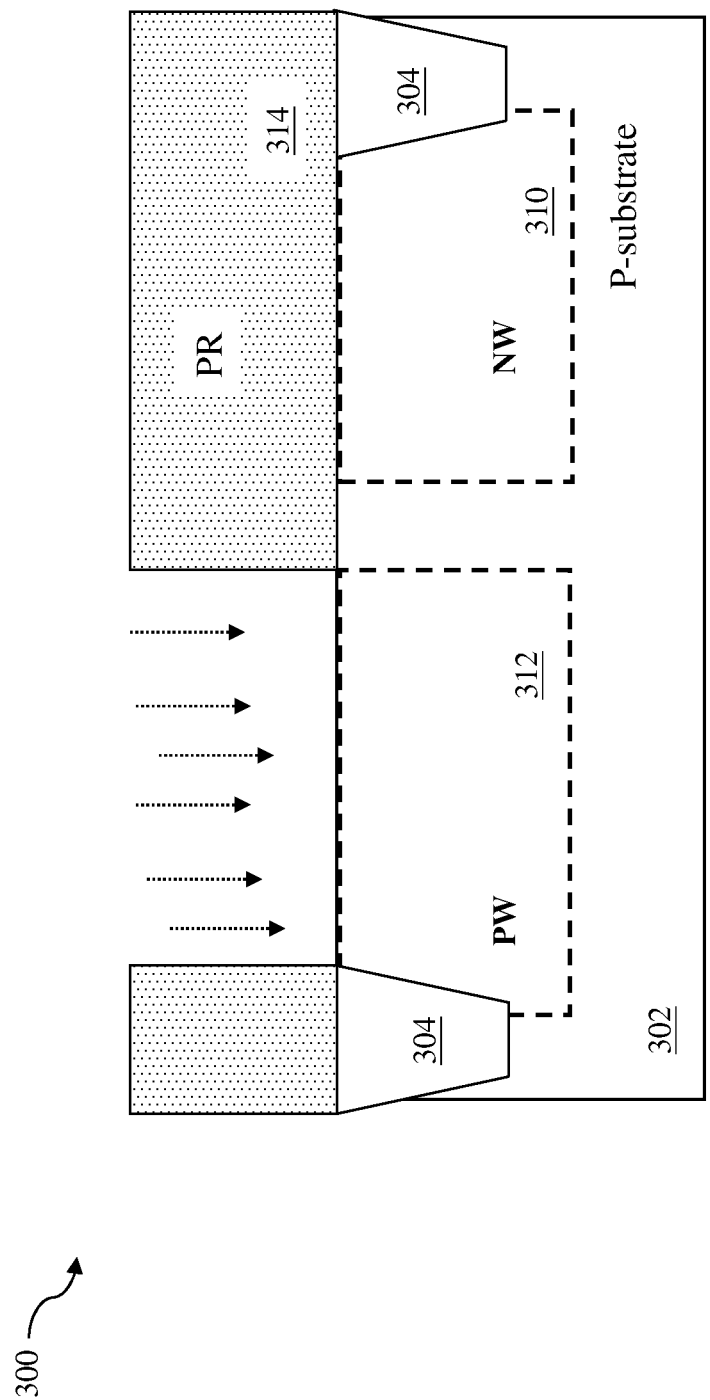

In FIG. 5, a P-well (PW) is formed in various regions of the P-substrate 202 by ion-implantation or diffusion techniques known in the art. The P-well 312 may be formed in a similar manner as was discussed above for the N-well 310. A P-well mask is used to pattern a photoresist layer 314 that protects the N-well 310. An ion implantation utilizing a P-type dopant, such as boron, may be performed to form the P-well 312 in the region where a source feature will be subsequently formed. It is noted that other ion implantation processes may also be performed to adjust threshold voltages of the core NMOS and PMOS devices in the other active regions of the substrate 302 as is known in the art.

Figure 6:
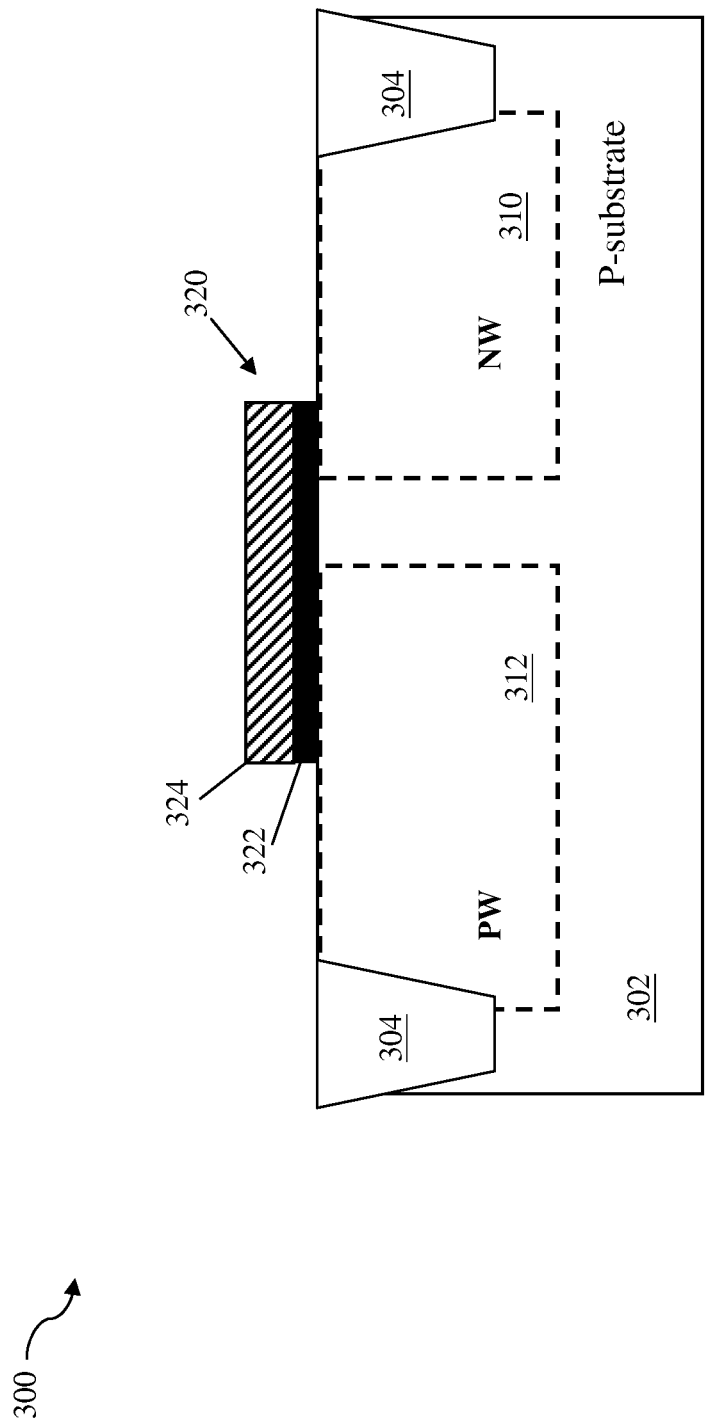

In FIG. 6, gate structures are formed for the various devices. The gate structure 320 may be disposed on the substrate 302, including a gate dielectric 322 formed on the substrate, and a gate electrode 324 formed on the gate dielectric. Further, the gate structure 320 overlies a portion of the N-well 310 and a portion of the P-well 312.

The gate dielectric 322 may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric may have a multilayer structure such as one layer of silicon oxide and another layer of high k material. The gate dielectric may be formed using chemical vapor deposition (CVD), physical vapor deposition (PVD), atomic layer deposition (ALD), thermal oxide, other suitable processes, or combinations thereof.

The gate electrode 324 may be configured to be coupled to metal interconnects and may be disposed overlying the gate dielectric 322. The gate electrode may include a doped polycrystalline silicon (or polysilicon). Alternatively, the gate electrode layer may include a metal such as Al, Cu, W, Ti, Ta, TiN, TaN, NiSi, CoSi, other suitable conductive materials, or combinations thereof. The gate electrode layer may be formed by CVD, PVD, plating, and other proper processes. The gate electrode layer may have a multilayer structure and may be formed in a multiple-step process using a combination of different processes.

The gate dielectric layer and the gate electrode layer formed on the substrate are then patterned to form a plurality of gate structures using a process including photolithography patterning and etching. One exemplary method for patterning the gate dielectric and electrode layers is described below. A layer of photoresist is formed on the polysislicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes and gate dielectric, in a plurality of processing steps and various proper sequences. The photoresist layer may be stripped thereafter. In another embodiment, only the gate electrode layer is patterned. In another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD.

Figure 7:
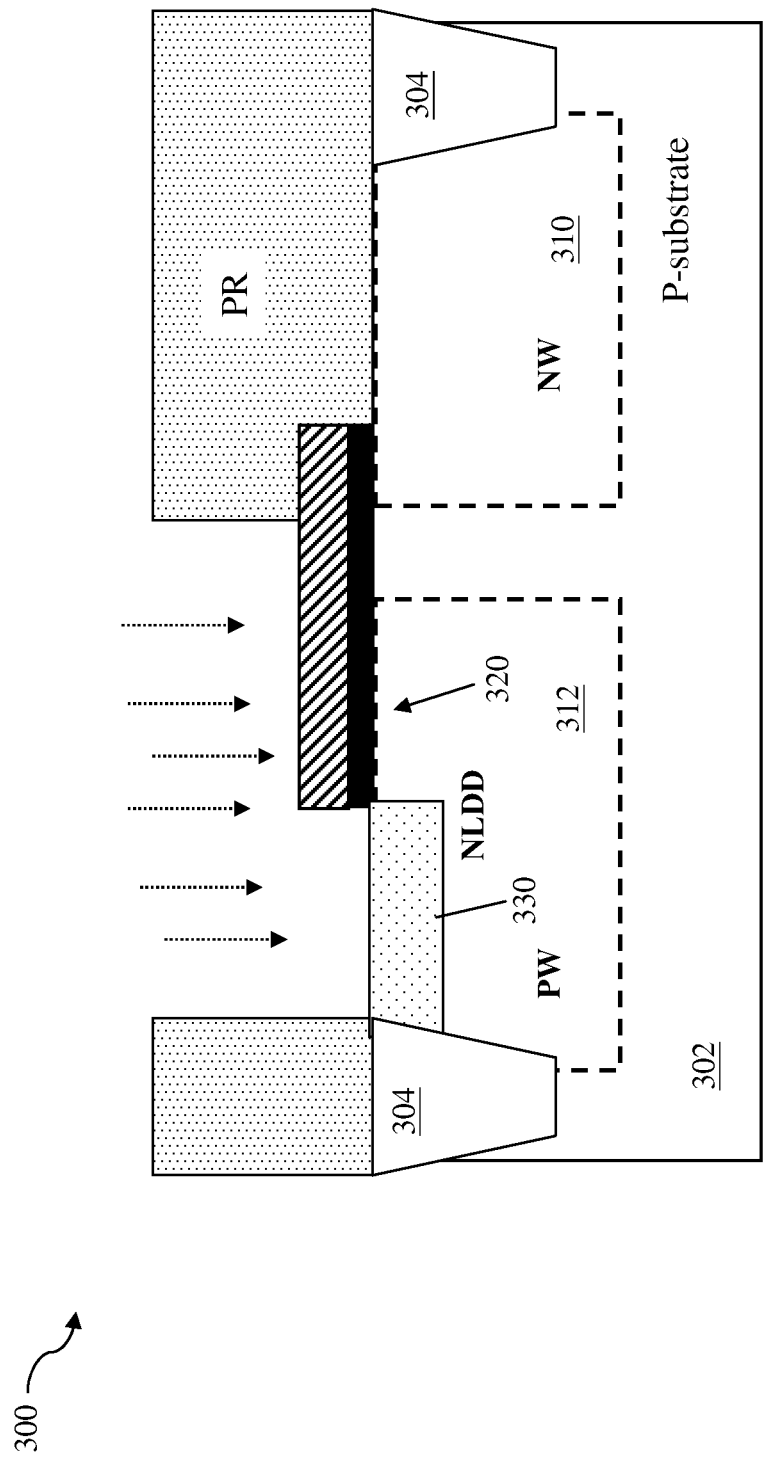

In FIG. 7, a lightly doped region 330 of an n-type (referred to as NLDD) may be formed in the P-well 312. The NLDD region 330 may be laterally positioned on a sidewall of the gate structure 320. As previously noted, the chip of semiconductor device 300 may include various NMOS and PMOS devices formed in other active regions of the substrate 302. Accordingly, the NLDD region 330 may be formed concurrently (same stage) with formation of lightly doped drain regions of an n-type in the other active regions of the substrate 302 for the NMOS devices. The NLDD region 330 may have an edge substantially self-aligned to an edge of the gate structure 320. The NLDD region 330 may include n-type dopant such as phosphorus or arsenic. The NLDD regions are formed by a method including ion implantation or diffusion. It is understood that a process to form lightly doped drain regions of a p-type (PLDD) regions in other active regions of the substrate for PMOS devices may be performed. Accordingly, the NMOS devices including the present embodiment may be protected by a patterned photoresist layer.

Figure 8:
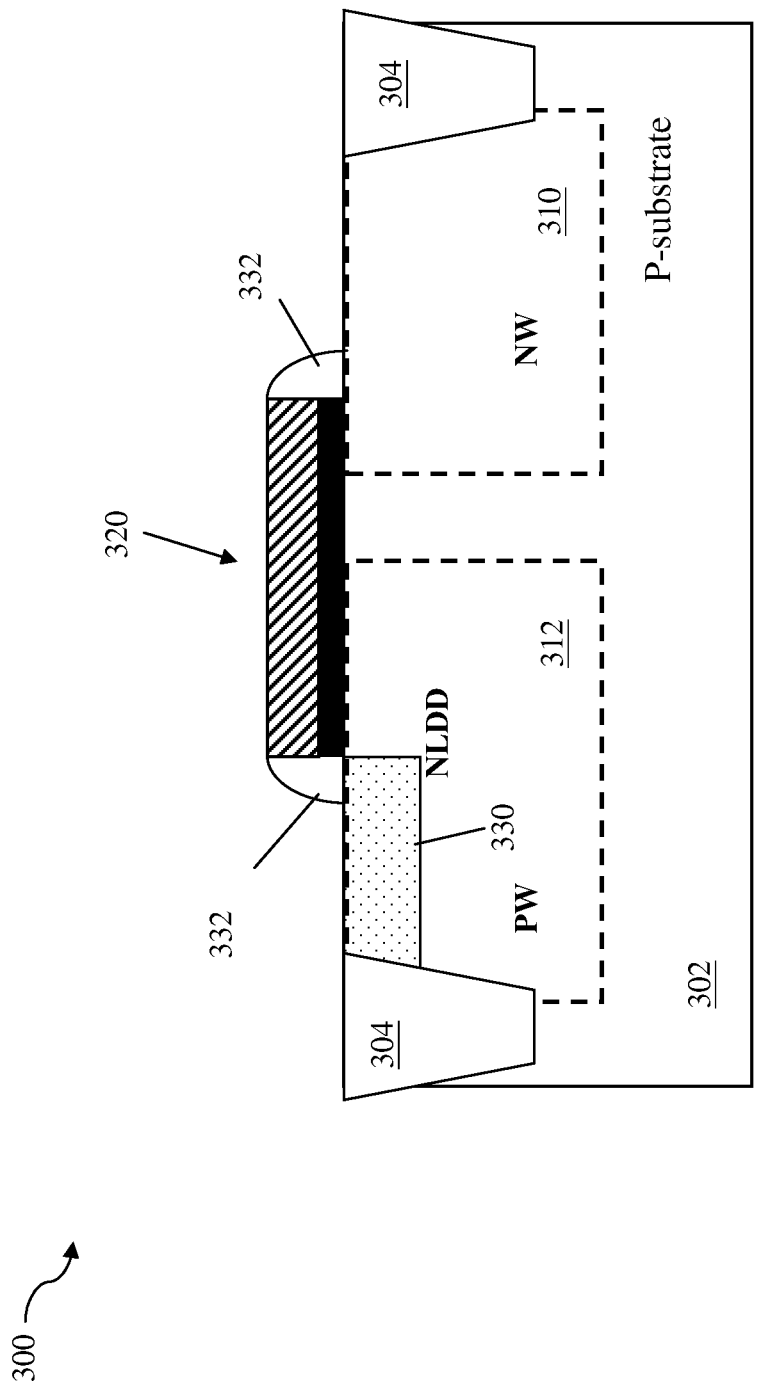

In FIG. 8, sidewall spacers 332 may be formed on both sidewalls of the gate structure 320. The sidewall spacers 332 may include a dielectric material such as silicon oxide. Alternatively, the sidewall spacers 332 may optionally include silicon nitride, silicon carbide, silicon oxynitride, or combinations thereof. In some embodiments, the sidewall spacers 332 may have a multilayer structure. The sidewall spacers 332 may be formed by a deposition and etching (with an anisotropic etching technique) process as is known in the art.

As previously noted, the chip of semiconductor device 300 may include various NMOS and PMOS devices formed in other active regions of the substrate 302. Accordingly, strained source and drain features may be formed in the other active regions of the substrate 302 for the PMOS devices to exert stress/strain in the channel region thereby enhancing carrier mobility and improving device performance. For example, strained source and drain features may be formed in the substrate 302 by an epitaxial silicon germanium (SiGe) process. Further, the epi SiGe process is also utilized to form a barrier region and provide a resistive path of the NHVMOS device as discussed below. That is, the barrier region is formed of epi SiGe which will provide high blocking voltage capability of the NHVMOS device. Additionally, since the barrier region of the NHVMOS device is formed concurrently (same stage) with the formation of the strained source and drain features for the PMOS devices in the other active regions of the substrate 302, no additional steps and/or photomasks are needed.

Figure 9:
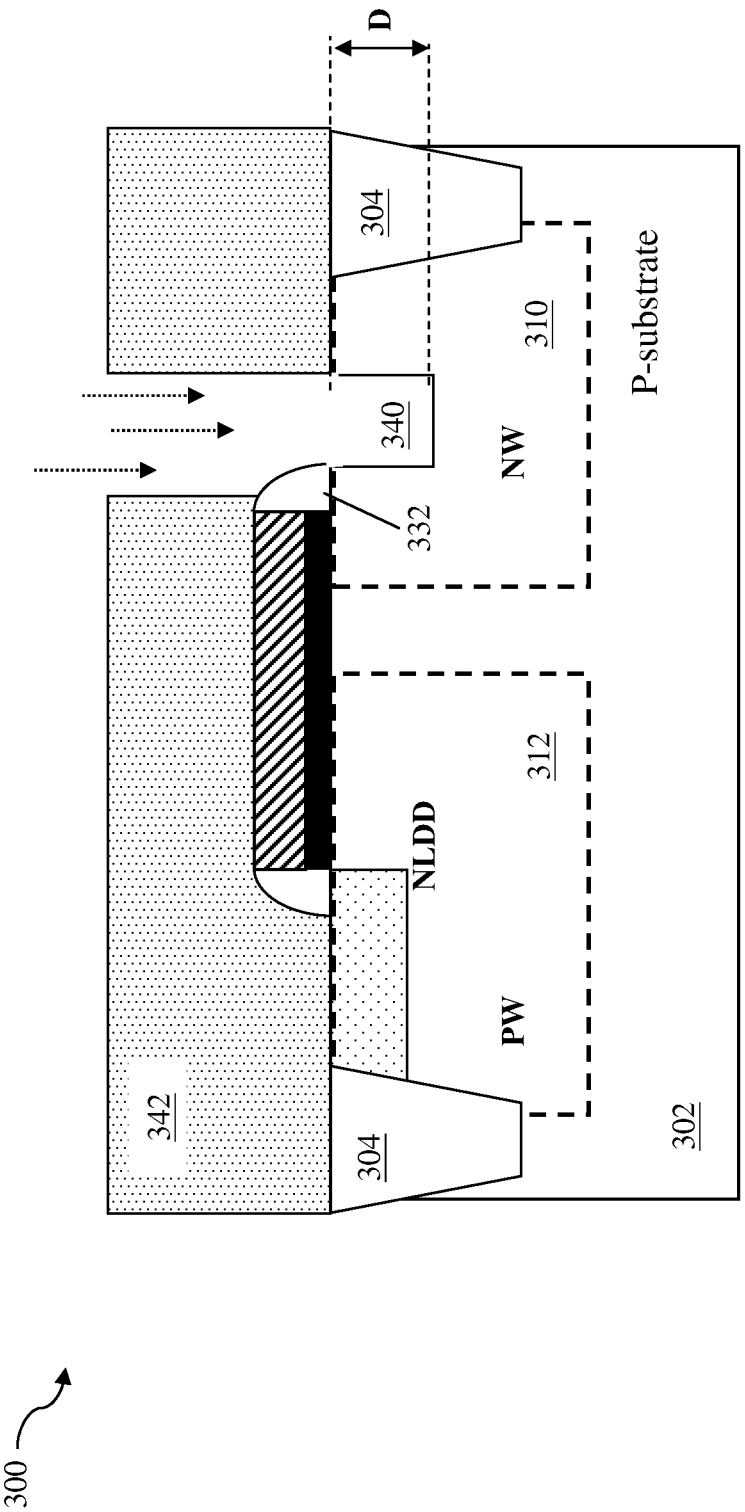

In FIG. 9, an etching process is performed to a recess 340 in the substrate 302. A patterned photoresist 342 is formed to define a region in the N-well 310. The etching process may include a dry etching, wet etching, or combination thereof. In the present embodiment, the etching process includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes a portion of the silicon substrate 302 that is unprotected or exposed. Accordingly, the recess 340 has a vertical sidewall that is aligned with one of the spacers 332 due to the directional/anisotropic etching. The recess 340 may have a depth D ranging from about 400 to about 800 Angstrom (Å). In some embodiments, a pre-cleaning process may be performed to clean the recess 340 with HF or other suitable solution.

Figure 10:
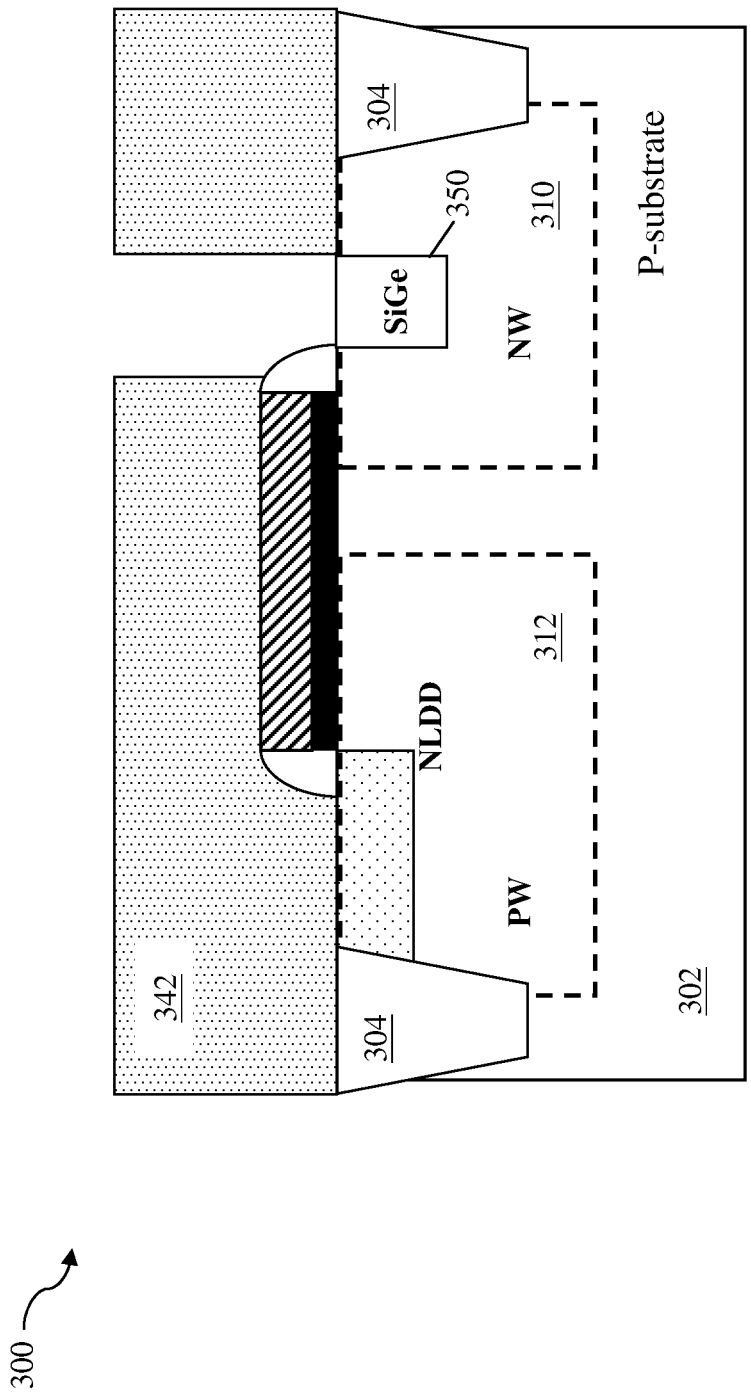

In FIG. 10, an epitaxial process is performed to grow a semiconductor material layer in the recess 340. The semiconductor material is different from the substrate 302. In the present embodiment, silicon germanium (SiGe) is deposited by an epi process in the recess 340 to form a SiGe feature 350 in a crystalline state. The epi SiGe process is known in the art, and thus not described in detail herein. Additionally, the SiGe 350 may be deposited such that it is raised above the surface of the substrate 302. In furtherance of the present embodiment, the SiGe feature 350 may be in-situ doped with p-type impurities, such as boron. The p-type doped SiGe feature 350 forms a PN junction with respect to the N-well 310 and is disposed deeper in the substrate 302 as compared to the barrier region 112 of FIG. 1. Accordingly, the resistive path associated with the SiGe feature 350 is greater than the resistive path associated with the barrier region 112 of FIG. 1, and thus the high blocking voltage capability of the NHVMOS device is improved. Additionally, it is noted the a loading effect of the epi SiGe process is improved since more regions of the substrate 302 are opened for epi growth. Further, although the core PMOS devices may be smaller than the NHVMOS, the SiGe feature 350 may have a similar depth and doping concentration as those strained features in the core PMOS devices.

Figure 11:
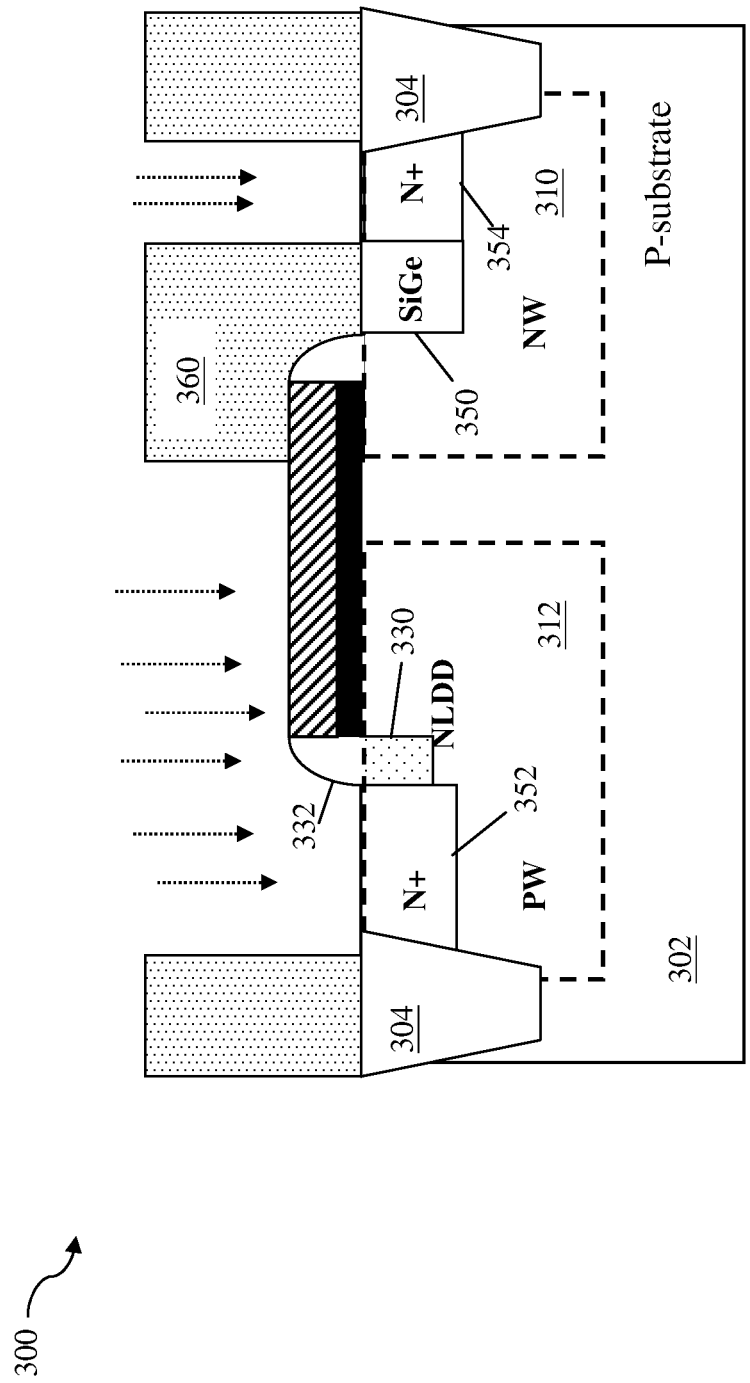

In FIG. 11, a source 352 and a drain 354 of an N-type (referred to as N+ or heavily doped region) may be formed. For example, source/drain of an N-type (N+) for the core NMOS devices and NHVMOS device may be formed. The source 352 and drain 354 may be positioned at both sides of the gate structure 320 and interposed thereby. In the present embodiment, a patterned photoresist layer 360 is formed to define an opening over the P-well 312, and an opening over the N-well 310 adjacent the SiGe feature 350. The source 352 and drain 354 regions include an N-type dopant such as phosphorus or arsenic. The source 352 and drain 354 may be formed by a method such as ion implantation or diffusion. The source 352 is aligned with one of the spacers 332, and the drain 354 is disposed adjacent the SiGe feature 350. A rapid thermal annealing (RTA) process may be used to activate the implanted dopant. In various embodiments, the source and drain regions may have different doping profiles formed by multi-process implantation. It should be noted that a process to form source/drain of a p-type (referred to as P+ or heavily doped region) may be performed for the PMOS devices in the other active regions of the substrate 302. Accordingly, the NMOS devices including the present embodiment may be protected by a patterned photoresist layer.

Figure 12:
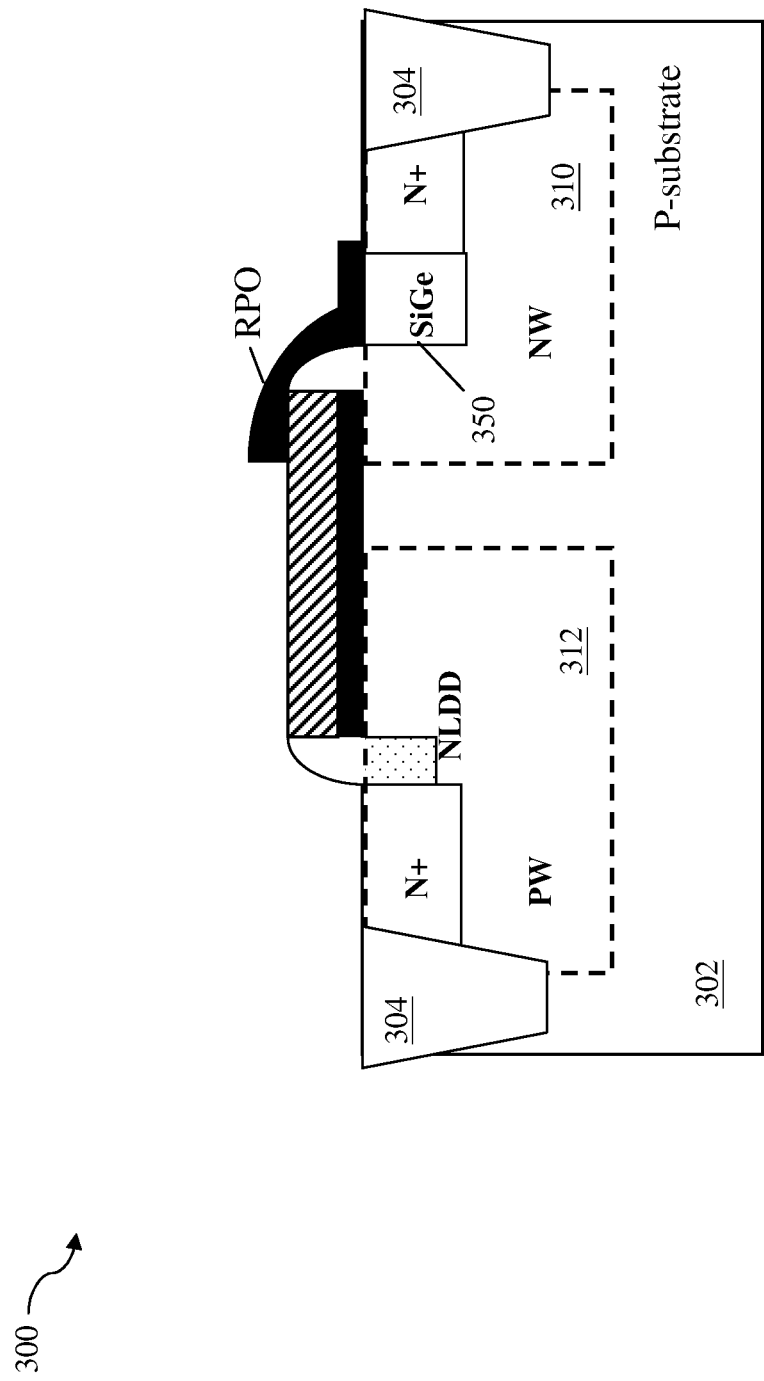

In FIG. 12, a resist protective oxide (RPO) may be formed to function as a silicide blocking layer during a subsequent salicide process. In the present embodiment, the RPO is formed over the SiGe feature 350. The RPO may be formed by depositing an oxide layer over the substrate 302 and patterning the oxide layer. The RPO will protect the SiGe feature 350, and thus prevent silicide features from being formed on the SiGe feature.

Figure 13:
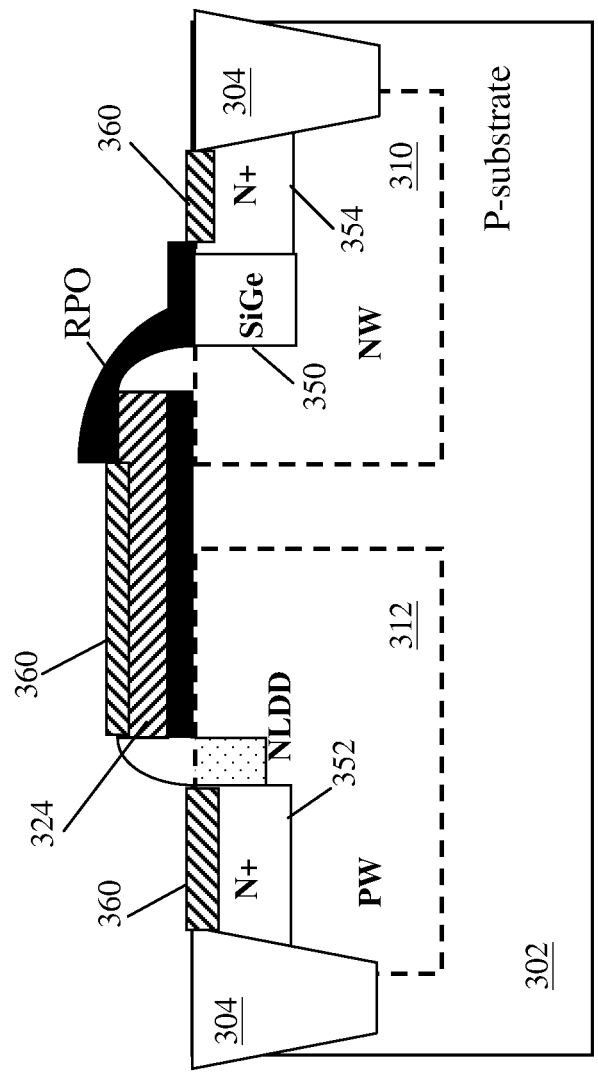

In FIG. 13, silicide features 360 are formed on the source region 352, drain region 354, and gate electrode 324 to reduce contact resistance. In the present embodiment, the silicide features 360 may be formed by silicidation such as self-aligned silicidation (salicidation) in which a metal material is formed over the substrate 302, then the temperature is raised to anneal and cause reaction between underlying silicon and the metal to form silicide, and then the un-reacted metal is etched away. As noted above, the RPO prevents silicidation of the SiGe feature 350.

It is understood that the semiconductor device 300 may undergo further processing to complete fabrication. For example, a plurality of patterned dielectric layers and conductive layers are formed on the substrate to form multilayer interconnects configured to couple the various p-type and n-type doped regions, such as the source, drain region, contact region, and gate electrode. In one embodiment, an interlayer dielectric (ILD) and a multilayer interconnect (MLI) structure are formed in a configuration such that the ILD separates and isolates each metal layer from other metal layers of the MLI structure. In furtherance of the example, the MLI structure includes contacts, vias and metal lines formed on the substrate. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structure may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. Chemical mechanical polishing (CMP) technique is implemented afterward to etch back and planarize the substrate surface.

The disclosed structure and method may have various embodiments, modifications and variations. In one example, the semiconductor device may further include a stress layer overlying the substrate and gate features. The stress layer may comprise silicon nitride, silicon oxynitride, silicon oxide, and silicon carbide. In another embodiment, the source and drain regions may have different structures, such as raised, recessed, or strained. The high voltage device may not be limited to an n-type MOS device and can be extended to a p-type MOS device with a similar structure and configuration except that all doping types may be reversed and with a DNW buried substrate. The corresponding dimensions are modified according to the design for the desired transistor performance. Further embodiments may also include, but are not limited to, vertical diffused metal-oxide-semiconductor (VDMOS), other types of high power MOS transistors, Fin structure field effect transistors (FinFET), and strained MOS structures.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor device, comprising:
a semiconductor substrate;
a gate structure formed on the substrate;
a lightly doped region formed in the substrate and aligned with a sidewall of the gate structure, the lightly doped region having a first type of conductivity;

a source and a drain formed in the substrate at either side of the gate structure, the source and drain having the first type of conductivity; and a barrier region formed in the substrate and adjacent the drain, wherein the barrier region is formed of a semiconductor material different from the semiconductor substrate and wherein the barrier region has a second type of conductivity, the second type of conductivity being different than first type of conductivity, wherein the semiconductor material includes silicon germanium (SiGe) and the semiconductor substrate is formed without SiGe.

2. The semiconductor device of claim 1, wherein the first type of conductivity includes an n-type and wherein the second type of conductivity includes a p-type.

3. The semiconductor device of claim 1, further comprising:
a first well having the second type of conductivity and formed in the substrate, the first well surrounding the source and the lightly doped region and directly underlying a first portion of the gate structure; and
a second well having the first type of conductivity and formed in the substrate, the second well surrounding the drain and the barrier region and directly underlying a second portion of the gate structure different from the first portion.

4. The semiconductor device of claim 1, wherein the semiconductor device includes an n-type high voltage MOS (NHVMOS) device.

5. The semiconductor device of claim 1, further comprising spacers formed on sidewalls of the gate structure;
wherein a first edge of the barrier region is aligned with one of the spacers and a second edge of the barrier region is adjacent the drain.

6. The semiconductor device of claim 1, further comprising a resist protective oxide (RPO) formed directly over the barrier region.

7. The semiconductor device of claim 1, wherein the drain is formed of a first material having the first type of conductivity at a first concentration, and
wherein the barrier region is formed of a second material having the second type of conductivity at a second concentration, the first material being different than the second material.

8. A semiconductor device, comprising:
a semiconductor substrate;
a first well of a first type of conductivity disposed in the substrate;
a second well of a second type of conductivity disposed in the substrate, the second type of conductivity being different than the first type of conductivity;
a gate structure disposed on the substrate, the gate structure having a first portion overlying the first well and a second portion overlying the second well;
a source of the first type of conductivity disposed in the second well;
a drain of the first type of conductivity disposed in the first well;
a barrier region being of the second type of conductivity and disposed in the first well and adjacent the drain, the barrier region being formed of a semiconductor material different from the semiconductor substrate; and
a lightly doped region disposed in the second well at a first depth from a surface of the substrate;
wherein the barrier region is disposed in the first well at a second depth from the surface of the substrate, the second depth being greater than the first depth.

9. The semiconductor device of claim 8, wherein the first type of conductivity includes an n-type and wherein the second type of conductivity includes a p-type.

10. The semiconductor device of claim 9, wherein the barrier region is doped with a p-type dopant.

11. The semiconductor device of claim 8, wherein the semiconductor material includes silicon germanium (SiGe).

12. The semiconductor device of claim 8, further comprising a resist protective oxide (RPO) disposed on the barrier region.

13. The semiconductor device of claim 8, further comprising silicide features disposed on the source, the drain, and the gate structure.

14. The semiconductor device of claim 8, wherein the barrier region includes silicon germanium (SiGe) and the drain is without SiGe.

15. An apparatus comprising:
a gate structure formed on a surface of a substrate;
a lightly doped region disposed in the substrate at a first depth from the surface of the substrate and having a first type of conductivity;
a source and a drain disposed in the substrate at either side of the gate structure, the source and drain having the first type of conductivity, the drain formed of a first material; and
a barrier region disposed in the substrate and adjacent the drain, wherein the barrier region is formed of a second material that is different from the first material of the drain, wherein the barrier region has a second type of conductivity such that the second type of conductivity is different than first type of conductivity type, wherein the barrier region is disposed in the substrate at a second depth from the surface of the substrate, the second depth being greater than the first depth.

16. The apparatus of claim 15, wherein the barrier region extends laterally within the substrate away from the gate structure and has a first edge adjacent a channel region under the gate structure and an opposing second edge adjacent the drain such that the barrier region does not extend laterally beyond the drain.

17. The apparatus of claim 15, further comprising a resist protective oxide (RPO) formed over and in physical contact with the gate structure and the barrier region.

18. The apparatus of claim 15, further comprising an isolation structure disposed in the substrate, wherein the drain is closer to the isolation structure than any portion of the barrier region.

19. The apparatus of claim 15, wherein the drain extends a first depth from a top surface of the substrate and the barrier region extends a second depth from the top surface of the substrate, the first depth being greater than the second depth.

20. The apparatus of claim 15, wherein the barrier region includes silicon germanium (SiGe) and the semiconductor substrate is formed without SiGe.

* * * * *